(12) United States Patent
Kain et al.

(10) Patent No.: US 9,157,939 B2
(45) Date of Patent: Oct. 13, 2015

(54) SYSTEM AND DEVICE FOR DETERMINING ELECTRIC VOLTAGES

(75) Inventors: Clemens Kain, Kammern (AT); Guenter Gross, Graz (AT)

(73) Assignee: Infineon Technologies AG, Neubiberg (DE)

(*) Notice: Subject to any disclaimer, the term of this patent is extended or adjusted under 35 U.S.C. 154(b) by 672 days.

(21) Appl. No.: 13/571,148

(22) Filed: Aug. 9, 2012

(65) Prior Publication Data

US 2014/0043031 A1   Feb. 13, 2014

(51) Int. Cl.
| | |
|---|---|
| *G01N 27/416* | (2006.01) |
| *H03M 1/12* | (2006.01) |
| *H03M 1/38* | (2006.01) |
| *G01R 19/165* | (2006.01) |
| *G01R 31/36* | (2006.01) |
| G01R 19/25 | (2006.01) |
| H03M 1/10 | (2006.01) |
| H03M 1/14 | (2006.01) |
| H03M 1/46 | (2006.01) |
| H03M 1/56 | (2006.01) |

(52) U.S. Cl.
CPC ........ *G01R 19/16542* (2013.01); *G01R 31/362* (2013.01); *G01R 31/3658* (2013.01); *H03M 1/1225* (2013.01); *G01R 19/2503* (2013.01); *H03M 1/1014* (2013.01); *H03M 1/144* (2013.01); *H03M 1/46* (2013.01); *H03M 1/56* (2013.01)

(58) Field of Classification Search
CPC .... G01N 27/416; G01R 31/362; G01R 31/36; H03M 1/12; H03M 1/122; H03M 1/123; H03M 1/38; H03M 1/40; H03M 1/46

USPC .......... 424/433, 434, 426, 427–430; 341/155, 341/161, 162, 169
See application file for complete search history.

(56) References Cited

U.S. PATENT DOCUMENTS

| | | | | |
|---|---|---|---|---|
| 3,403,361 | A | * | 9/1968 | Koch .............................. 334/40 |
| 3,683,369 | A | * | 8/1972 | Stern ............................. 341/169 |
| 4,055,166 | A | * | 10/1977 | Simpson et al. .............. 600/549 |
| 4,257,034 | A | * | 3/1981 | Wilkinson .................... 341/118 |
| 4,724,397 | A | * | 2/1988 | Davis ............................ 330/256 |
| 4,940,982 | A | * | 7/1990 | Gulczynski ................... 341/169 |
| 5,513,062 | A | * | 4/1996 | Paul et al. ....................... 361/90 |
| 5,602,483 | A | * | 2/1997 | Uhling et al. ................. 324/601 |

(Continued)

FOREIGN PATENT DOCUMENTS

JP    2000-092732    * 3/2000

OTHER PUBLICATIONS

Tietze, U., et al., "Halbleiter-Schaltungstechnik (Semiconductor Circuit Design)," Springer-Verlag Berlin Heidelberg, 14th Edition, Nov. 23, 2012, pp. 1019-1020.

*Primary Examiner* — Patrick Assouad
*Assistant Examiner* — Lamarr Brown
(74) *Attorney, Agent, or Firm* — Slater & Matsil, L.L.P.

(57) ABSTRACT

A method and to a system can be used for measuring electric voltages in batteries with a number of battery cells. A measuring circuit includes at least one digital analog converter that constitutes, in combination with a number of comparators, an analog digital converter to determine the electric voltages of the battery cells. The comparators compare a reference voltage generated by the digital analog converter with the electric voltage of the battery cells over a number of separate measuring channels to the individual battery cells.

29 Claims, 5 Drawing Sheets

(56) References Cited

U.S. PATENT DOCUMENTS

| | | | |
|---|---|---|---|
| 6,118,384 A * | 9/2000 | Sheldon et al. | 340/636.15 |
| 6,118,400 A * | 9/2000 | Susak | 341/172 |
| 6,177,899 B1 * | 1/2001 | Hsu | 341/156 |
| 6,239,734 B1 * | 5/2001 | Bae et al. | 341/164 |
| 6,373,256 B1 * | 4/2002 | Hanjani et al. | 324/433 |
| 6,888,355 B2 * | 5/2005 | Kitazawa et al. | 324/444 |
| 7,271,751 B2 * | 9/2007 | Peterson et al. | 341/120 |
| 7,439,898 B1 * | 10/2008 | Nittala et al. | 341/163 |
| 7,522,077 B1 * | 4/2009 | Itkin | 341/120 |
| 7,555,091 B1 * | 6/2009 | Lewicki et al. | 375/376 |
| 7,564,217 B2 * | 7/2009 | Tanigawa et al. | 320/118 |
| 7,633,416 B2 * | 12/2009 | Horisaki | 341/120 |
| 7,782,234 B2 * | 8/2010 | Ahmad | 341/155 |
| 7,818,644 B2 * | 10/2010 | Rajski et al. | 714/732 |
| 7,916,063 B1 * | 3/2011 | Portmann et al. | 341/163 |
| 7,924,207 B2 * | 4/2011 | Snoeij et al. | 341/169 |
| 7,973,695 B2 * | 7/2011 | Kudo | 341/169 |
| 7,995,123 B2 * | 8/2011 | Lee et al. | 348/294 |
| 8,089,387 B2 * | 1/2012 | Baker | 341/155 |
| 8,154,253 B2 * | 4/2012 | Omagari | 320/134 |
| 8,390,501 B2 * | 3/2013 | Chang et al. | 341/163 |
| 8,508,399 B2 * | 8/2013 | Lee et al. | 341/163 |
| 8,570,047 B1 * | 10/2013 | Davies et al. | 324/434 |
| 8,659,309 B2 * | 2/2014 | Howe et al. | 324/750.3 |
| 8,659,457 B2 * | 2/2014 | Eliezer et al. | 341/120 |
| 8,659,463 B2 * | 2/2014 | Cho et al. | 341/163 |
| 8,866,650 B2 * | 10/2014 | Spinks et al. | 341/120 |
| 8,896,315 B1 * | 11/2014 | Davies | 324/434 |
| 8,947,277 B2 * | 2/2015 | Lee et al. | 341/122 |
| 2002/0196025 A1* | 12/2002 | Freeman et al. | 324/426 |
| 2003/0044689 A1* | 3/2003 | Miyazaki et al. | 429/320 |
| 2003/0155975 A1* | 8/2003 | Ivanov et al. | 330/256 |
| 2005/0024251 A1* | 2/2005 | Harada et al. | 341/163 |
| 2007/0188134 A1* | 8/2007 | Hussain et al. | 320/114 |
| 2008/0094056 A1 | 4/2008 | Huang | |
| 2008/0158363 A1* | 7/2008 | Myers | 348/187 |
| 2008/0164882 A1* | 7/2008 | Jaeger et al. | 324/434 |
| 2009/0128347 A1* | 5/2009 | Bucella et al. | 340/654 |
| 2009/0195431 A1 | 8/2009 | Snoeij et al. | |
| 2010/0166855 A1* | 7/2010 | Sabetsky | 424/457 |
| 2010/0225496 A1* | 9/2010 | Hou et al. | 340/636.1 |
| 2010/0244847 A1* | 9/2010 | Kudo et al. | 324/433 |
| 2011/0050236 A1* | 3/2011 | Sekizaki et al. | 324/426 |
| 2011/0169452 A1* | 7/2011 | Cooper et al. | 320/116 |
| 2012/0001615 A1* | 1/2012 | Levine | 324/71.5 |
| 2012/0242282 A1* | 9/2012 | Wada et al. | 320/107 |
| 2012/0264390 A1* | 10/2012 | Clevorn et al. | 455/313 |
| 2012/0313618 A1* | 12/2012 | Phillips | 324/74 |
| 2013/0201587 A1* | 8/2013 | Baek | 361/86 |
| 2014/0191890 A1* | 7/2014 | Spinks et al. | 341/120 |

* cited by examiner

SYSTEM AND DEVICE FOR DETERMINING ELECTRIC VOLTAGES

TECHNICAL FIELD

The invention relates to a method and a system for measuring electric voltages. The invention relates, in particular embodiments, to a measuring device for determining electric voltages in batteries for electric vehicles.

BACKGROUND

For applications in electric vehicles, a plurality of battery cells is usually combined with one another, wherein the battery cells are as a rule lithium ion (LION) cells. To this end, the battery cells are connected with each other in series, so that a battery stack of a plurality of cells with voltages of some hundred volts results. This battery stack is in turn divided into so-called battery blocks that may each be controlled and monitored by a separate control.

A so-called ASIC (application-specific integrated circuit) chip may, for instance, be used as a control. The object of these chips is to detect differences between the individual LION cells which are due to manufacturing and aging so as to be able to react appropriately, for instance, by specifically discharging some cells or blocks (passive balancing) or specifically redistributing charge between the cells or blocks (active balancing).

For an optimum control of the battery, as exact measuring values as possible about the voltages of the individual battery cells (cell voltages) have to be provided. Furthermore, any cell voltages have to be measured and monitored individually in such battery stacks with series connections alone for safety reasons. In doing so, a preferably simultaneous measuring of all cell voltages has to be aimed at.

In the corresponding battery blocks that comprise a number of 12 battery cells, for instance, different total voltages (common mode voltages) up to 60V may occur, which cause high demands to signal processing and measuring accuracy also for integrated circuits with high voltage technology.

The common mode voltage is defined as the average voltage of the positive and the negative voltage of a battery cell and hence corresponds to half the sum of the positive potential and the negative potential with respect to ground. The common mode voltage results, for instance, from the measured voltage of a battery cell with respect to ground, wherein a differential voltage is detected as a difference from the amount of the positive and the negative voltage. The common mode voltage interferes with cell voltages, so that one intends to eliminate it from the measurement procedure.

The common mode voltage is therefore no directly measurable voltage, but a mathematical voltage value that is used by the battery control. With the batteries in question, the common mode voltage may amount to up to 60 volts. Only the cell voltage can be measured, wherein the voltage of each battery may be different and each cell voltage may also have a different common mode level.

For measuring cell voltages in battery series connections, an analog digital converter (ADC) with a successive approximation register (SAR) or an ADC pursuant to the Sigma Delta (SD) method is used, wherein a respective HV multiplexer is used at the input thereof.

The construction of a measuring circuit with an analog digital converter and a successive approximation register has, however, as a consequence that a HV multiplexer is present in the signal path, which may have a disadvantageous effect on measuring accuracy. Moreover, the HV circuits of the multiplexer and the sample and hold members for the buffering of input voltages have a high space requirement on the integrated circuit.

SUMMARY OF THE INVENTION

The present invention suggests to use, for the measurement of cell voltages in battery series connections, a digital analog converter (DAC) constituting, in combination with a particular number of x comparators and in connection with a digital trigger logic, an analog digital converter (ADC) with a particular number of x HV channels. The suppression of the common mode voltage share in the input voltages may be implemented in the HV comparators that require HV capacities for this purpose.

The ADC usually has to be adapted to measure differential voltages across a large common mode range. The present invention avoids this demand in that the common mode voltage in the high voltage comparator is suppressed or subtracted, respectively, to determine the differential cell voltages. By suppressing the common mode voltage it is possible to determine and evaluate the differential voltage between the terminals of the respective battery cell. For this purpose, the voltage measured at the battery cell is reduced by the common mode share, so that the differential voltage between the terminals of the respective battery cell can be determined individually as a result.

One aspect of the invention thus relates to the construction of an ADC adapted to serially measure an HV channel or a plurality of independent HV channels. In accordance with the invention, only one DAC has to be used which is adapted to measure, along with a plurality of comparators and the logic, a plurality of voltages and hence constitutes an ADC. Due to this architecture it is additionally possible to simultaneously implement excess voltage or undervoltage detection of all input voltages of the measuring channels.

Since only one DAC is provided, it is possible to measure a plurality of independent HV measuring channels not in parallel, but in series. This way, it is not necessary to provide all circuit elements in parallel to each measuring channel, but only one DAC has to be used for all channels, for instance. Although the cell voltages on the measuring channels are measured sequentially only, a quasi-parallel measuring window may be generated by the performance of a plurality of measurement loops according to the invention. This makes it possible to compensate the gain errors of all measuring channels with just one gain compensation, which will be dealt with in detail later on.

The arrangement according to the invention further renders it possible to implement a window comparator function without additional circuit components. By means of a window comparator function it is, for instance, possible to implement excess voltage or undervoltage detection for all HV measuring channels. In the case of some measuring problems it is, for instance, sufficient to know whether or not a threshold was exceeded. In doing so, the window comparator function can likewise be performed sequentially in a number of comparator loops in that initially an excess voltage is checked for all measuring channels and then the undervoltage is checked for all measuring channels.

By means of a window comparator it is possible to define a high reference voltage and a low reference voltage and to detect whether an input voltage remains within these limits. The present invention can support this window comparator function without the use of new components being required. With the voltage measurement according to the invention such a window comparator function may be integrated. The voltage measurement according to the invention is able to perform this window comparator function even after the detection of the individual cell voltages, and then check whether the cell voltages are within a particular voltage window.

Since for particular functions of the battery control there merely has to be detected whether the cell voltages are within their operating range, such a window comparator function may be sufficient. The window comparator function is easier to implement than the requirement of exactly determining every individual cell voltage.

During measuring by means of the comparator function as well as with the window comparator function a comparator decision is required since in the case of both functions a comparator compares the reference voltage generated with the DAC with the input voltage. By means of the comparator it is then possible to detect whether or not the reference voltage is higher than the input voltage.

Another aspect of the invention relates therefore to a system and a method for determining the input voltage of the comparators for measuring the electric voltages of the individual battery cells. As described above, in the method of determining the input voltage, the binary search & tracking mode is used that generates a valid digital output value of the DAC at a particular sample time. With the existence of a valid conversion it is possible to associate a measured cell voltage as an input voltage value with a particular measuring time. This makes it possible to abandon sample and hold members.

In accordance with the invention, the reference voltage may, for instance, by the binary search method and a tracking phase consisting of a number of tracking steps, be successively approximated to the cell voltage to be measured until the reference voltage exceeds the input voltage of the comparator. The exceeding of the reference voltage beyond the input voltage is detected by the comparator function in that the comparator toggles. The point of intersection of the input voltage with the reference voltage is detected by the comparator function by rendering a corresponding indication.

Since the voltage to be measured may, however, change during the conversion of the DAC, the invention provides a novel method constituting a combination of a method by means of the successive approximation register (SAR) and the tracking method. To this end, in the binary search phase the range of the input voltage is limited by means of the binary search method. In the subsequent tracking phase the control value of the DAC is increased or decreased, respectively, as a function of the comparator decision until the comparator toggles its output signal.

The last DAC value thus represents the result of the ADC conversion at the toggle time of the comparator. If the comparator does not detect any intersection of the DAC output voltage with the channel input voltage during this time, the conversion is invalid. This way it is possible to unambiguously detect a valid conversion.

If the comparator does not toggle within a defined number of tracking steps, an invalid conversion of the ADC exists. In the case of an invalid conversion there exists the possibility of using the result of the invalid conversion nevertheless by using the reference voltage of the last tracking cycle as a starting value for the reference voltage of a new tracking phase.

Sample and hold members in which a measuring value detected at a particular time may be stored may be provided upstream of the circuits of the ADC. A sample and hold member may, for instance, be implemented by a switch and a downstream capacitance. Once the switch is closed, an input voltage may be received in the capacitance (sample), and if the switch is opened, the input voltage remains or is stored, respectively, in the capacitance (hold).

The use of such sample and hold members is, however, difficult to implement with the present measuring problem of battery voltages since the common mode voltages are in the high volt range. In the case of such high volt applications large capacitances would be required which consume a large chip area. In accordance with the present invention it is possible to abandon the provision of sample and hold members since the division between binary search method and tracking phase renders it possible to unambiguously detect the validity of the conversion.

Since no sample and hold member is provided for storing the input signal, the input voltage may still change during the conversion. The abandonment of sample and hold members also means that the input voltages are permanently measured at the battery cells, so that the time of measurement cannot be indicated exactly. In order to nevertheless detect the toggle time of a comparator with a valid ADC value it is, for instance, also possible to use a time stamp by which the time is registered at which the sample time of the ADC value or of the reference voltage generated by the ADC, respectively, and/or the toggle time of a comparator took place. Once this toggle time has been recorded it is possible to gather therefrom that the cell voltage lies between the reference voltage values of the last and the penultimate tracking cycles. The accuracy of the voltage determination depends on the step width delivered by the DAC, wherein the number of steps performable in one approximation or in one binary search phase, respectively, depends on the bit width of the DAC.

The reference voltage generated by the DAC is set at the beginning of the binary search phase, for instance, to half the full scale value, wherein full scale value corresponds to the maximum output voltage of the DAC. The further reference voltages result in accordance with the binary search method until the digital data word and/or the input value of the DAC has been defined. In the course of the tracking phase following the binary search phase, the reference voltage is, by means of an algorithm executed in the DAC, adapted step by step to the step width predetermined by the resolution of the DAC and is hence approximated to the measured input voltage.

The step width predetermined by the binary resolution of the DAC is also referred to as least significant bit (LSB). In every tracking step, the reference voltage and the input voltage are compared with each other in the comparator. Once the intersection point between the reference voltage and the input voltage has been reached, the comparator will toggle. This is the moment for the control to detect that the intersection point of the input voltage with the reference voltage was exceeded.

The intersecting of the input voltage with the reference voltage ensures that at least one tracking step was performed with a reference voltage that was certainly below the input voltage, and at least one tracking step was performed with a reference voltage that was certainly above the input voltage. This makes it possible to conclude that the input voltage definitely has to lie between these two values.

When determining the individual cell voltages, a problem consists in that the voltages measured at the battery cell have a large common mode share ranging in the high volt range, and that the treatment of high voltage (HV) involves larger effort than the treatment of low voltage. By the inventive suppression of the common mode voltage ranging in the high volt range, the measured voltage is reduced from the individual common mode range thereof to a reference voltage in the low volt range. This voltage reduction may, in accordance with the invention, take place in the high volt comparator. Subsequently, the reduced voltages may be treated by means of low volt components. Once the common mode voltage share has been subtracted in this manner, it is possible to detect the voltage difference of the differential cell voltages in the low volt range with less effort and more exactly.

A further aspect of the invention relates to the compensation of channel-related gain errors and the compensation of gain errors of the DAC. Due to the construction of the measuring circuit according to the invention it is possible to compensate channel-related gain errors by means of a one-time trimming of the DAC as well as the automatic gain error correction of the DAC during operation. This way, it is possible to achieve a good long-term stability of the ADC. Moreover, the use of offset-compensated comparators and of a DAC with a small offset error makes it possible to implement a very accurate ADC by the gain correction or the compensation of the gain error, respectively.

During operation of an integrated circuit or chip, respectively, gain errors of the DAC may occur, for instance, due to environmental influences, which may be corrected by means of automatic gain correction. With the present invention it is possible to perform an initial trimming in the integrated circuit or chip of the measuring circuit according to the invention, in which the automatic gain correction of the trimming is accelerated since the initial mismatch need not be corrected repeatedly, but only during the first cycle of the procedure for correction of the gain error.

The trimming of this correction is implemented by the setting of a trimming amplifier by means of a trimming DAC value. In doing so, the circuit logic applies a particular trimming value to the trimming amplifier depending on the channel, said trimming value causing the reference value to be multiplied with a corresponding factor, which results in the reference voltage value for the DAC which is matched with the corresponding measuring channel. Thus, the gain error is compensated and/or corrected for every single channel. The accuracy of this correction depends on the magnitude of these trimming steps. The automatic gain correction is a phase of its own that may be performed prior to a measuring phase or a window comparator function.

For the automatic gain correction, the full scale value of the DAC is applied to an additional comparator as the reference voltage, and the reference voltage of the chip (internal chip reference voltage) and/or the band gap voltage of the measuring circuit as an input voltage. Subsequently, a trimming value from the control logic is applied to the trimming amplifier. The additional comparator now determines whether the reference voltage or the band gap voltage is higher. If the reference voltage is lower than the band gap voltage, the trimming value for the trimming amplifier and hence also the reference voltage are increased. If the reference voltage is higher than the band gap voltage, the trimming value and hence also the reference voltage are decreased.

Provided that the DAC and the comparators have no noteworthy offset error, all gain errors can be compensated in a channel-precise manner, i.e., for every single measuring channel, by the reference voltage of the DAC.

The automatic gain correction may, for instance, be implemented with an additional comparator. This additional comparator may simultaneously also deal with measuring problems in the low volt range. Thus, it is for example possible to perform gain balancing with the additional comparator before a measurement is performed with another comparator. In doing so, the maximum value (full scale value) of the DAC is first of all adapted, and subsequently the measurement is performed so as to ensure that no more gain error caused by the DAC will occur during the measurement.

The full scale value of the DAC is the value output at the DAC output if the maximum digital value (all bits=1) is available at the input of the DAC. If, for instance, a digital value of 0 to $2^{10}-1$ can be applied to a DAC, the DAC supplies the full scale value with a digital input value of $2^{10}-1$. This full scale value is supplied by the DAC as a maximum reference value to the respective inputs of the individual comparators including the additional comparator. The high volt comparators are designed for the high volt range while the additional comparator operates in the low volt range. The additional comparator may, for instance, have the function of comparing this full scale value of the DAC with a reference voltage.

In doing so, the input voltage range is limited by means of binary search in a first measuring phase. Subsequently, the DAC is triggered in the tracking mode until a signal edge in the output signal of the comparator is detected. If no signal edge is detected within a maximum number of steps, a so-called ADC fail may exist, so that a corresponding ADC-fail signal is generated.

Another aspect of the invention relates to a measuring method by means of an ADC with a number of measuring channels by means of which a quasi-parallel measurement of all channels can be achieved by statistical averaging of the individual ADC values. By means of this method it is possible to measure the measuring channels one after the other and in a number of loops repetitively, wherein it is possible to start with the first channel again after the last measured channel.

As described above, a binary search method with a subsequent tracking phase is performed with each measurement of a measuring channel until a valid conversion of the ADC takes place in order to determine the individual cell voltages. Then, the ADC values may be added as a result of the ADC conversion of each cannel in a separate adder and subsequently be divided by the number of measurement loops carried out in order to obtain an average value. If, for instance, the measuring channels are measured with a number of $2^B$ loops or repetitions, respectively, the averaged ADC value may be calculated by shifting the binary sum value in the adder by B-bit to the right. This way, statistical averaging can be achieved for $2^B$ measuring values.

By means of the correction of the gain error at the beginning of each measurement of a cell voltage of a battery it is possible to reduce or eliminate the influence of the gain error of the DAC as well as the influence of the offset error of the buffer for the DAC reference value on the measuring accuracy of the ADC. The measuring method according to the invention can fulfil this function even if the correction of the gain error takes place at separate times.

In accordance with the present invention it is even possible to correct the gain error automatically in that the DAC is set to maximum gain and compared with the band gap voltage. The reference voltage of the DAC is set such that the comparator changes its output value. This is to ensure that the end value of the DAC output voltage corresponds to the reference voltage.

The end value of the DAC output voltage is compared in the comparator with the reference voltage obtained from the band gap voltage. In doing so, the DAC output voltage is set to maximum gain, which corresponds to the actual full scale value and hence to the end value of the transfer characteristic of the analog digital converter. This full scale value is compared with the band gap voltage.

On this condition the DAC generates the relevant gain error due to the ADC characteristic. This is objected by the present invention in that the DAC is set to the full scale value by the measurement loops and this full scale value is then compared with the band gap voltage. Subsequently, this reference voltage of the DAC may be interfered with until this full scale value of the DAC corresponds to the band gap voltage.

Circuit blocks that generate a temperature-stable reference voltage are referred to as band gap circuits. In the embodiments illustrated in the Figures, the band bap voltage generated by the band gap circuits may be approximately 2.5 volts. The DAC reference voltage may, as in the present invention, correspond to the band gap voltage.

By means of an additional sample and hold member it would further be possible to perform a successive approximation register (SAR) algorithm. For this purpose, half the full scale voltage may be applied to the input region of the ADC, and then the voltage available at each battery cell may be scanned and there may be determined whether the available voltage is higher or lower than half the full scale voltage. Depending on whether the voltage available at the battery cell is higher or lower than half the full scale voltage, the reference voltage will then be increased or reduced, for instance, by ¼ of the full scale voltage. Subsequently, the individual cell voltages are measured in the above-described manner by means of a plurality of measurement loops, so that the exact voltage value can be determined for every battery cell.

Furthermore, this ensures that the correct voltage was applied to a particular time. This way, it is even possible to use a time stamp, for which otherwise a sample and hold member for high volt circuits would be required at the input of the ADC so as to store the high volt input voltage.

By means of the present invention, an ADC is implemented in the control electronics for battery stacks with a number of n battery cells by the use of a number of n comparators and one DAC. This way it is possible to replace the function of an ADC by one comparator each and one DAC for each of the n battery cells.

In accordance with the present invention it is consequently also possible to separately measure battery cells that are connected in series. For this purpose, an ADC is provided which comprises n measuring channels. In the case illustrated in the Figure, the ADC comprises 12 channels. In accordance with the present invention it may also be implemented by using only one DAC and in turn a number of n HV comparators, wherein the same DAC may be used for all channels.

This results in the saving of not having to provide and use its own ADC for every measuring channel, which would consume a larger chip area. Instead, according to the present invention only one DAC can be used for n channels, which is in turn provided with a number of n comparators.

In accordance with a further aspect of the present invention the voltage of every battery may be detected in series individually with the multi-channel ADC according to the invention, wherein each measurement generates a respective measuring value of the electric voltage of every battery. Subsequently, the series of measurements may be started again with the first battery, wherein this measurement loop may be repeated any number of times, for instance, 16 times. This results in a quasi-parallel measurement over the entire measuring time. On close examination, however, the measurement is sequential since the same DAC is used for every measurement, but an average value is generated by the temporal and/or statistical averaging which lies for all n measuring channels in the same time window of the measurement for a number of $2^B$ measurement loops and/or repetitions.

For the averaging of the measuring values, the B-bit shifting to the right may again be used, in which $2^B$ measuring values are added by means of an adder and the last B digits or bits of the digital sum value are then neglected in the digital component, which corresponds to a division of the sum by $2^B$. This kind of averaging by means of B-bit shifting to the right may, for instance, be performed if the technologies used do not have any high-performance digital component.

BRIEF DESCRIPTION OF THE DRAWINGS

In the following, the invention will be explained in more detail by means of embodiments and the enclosed drawings.

DETAILED DESCRIPTION OF ILLUSTRATIVE EMBODIMENTS

Figure 1:
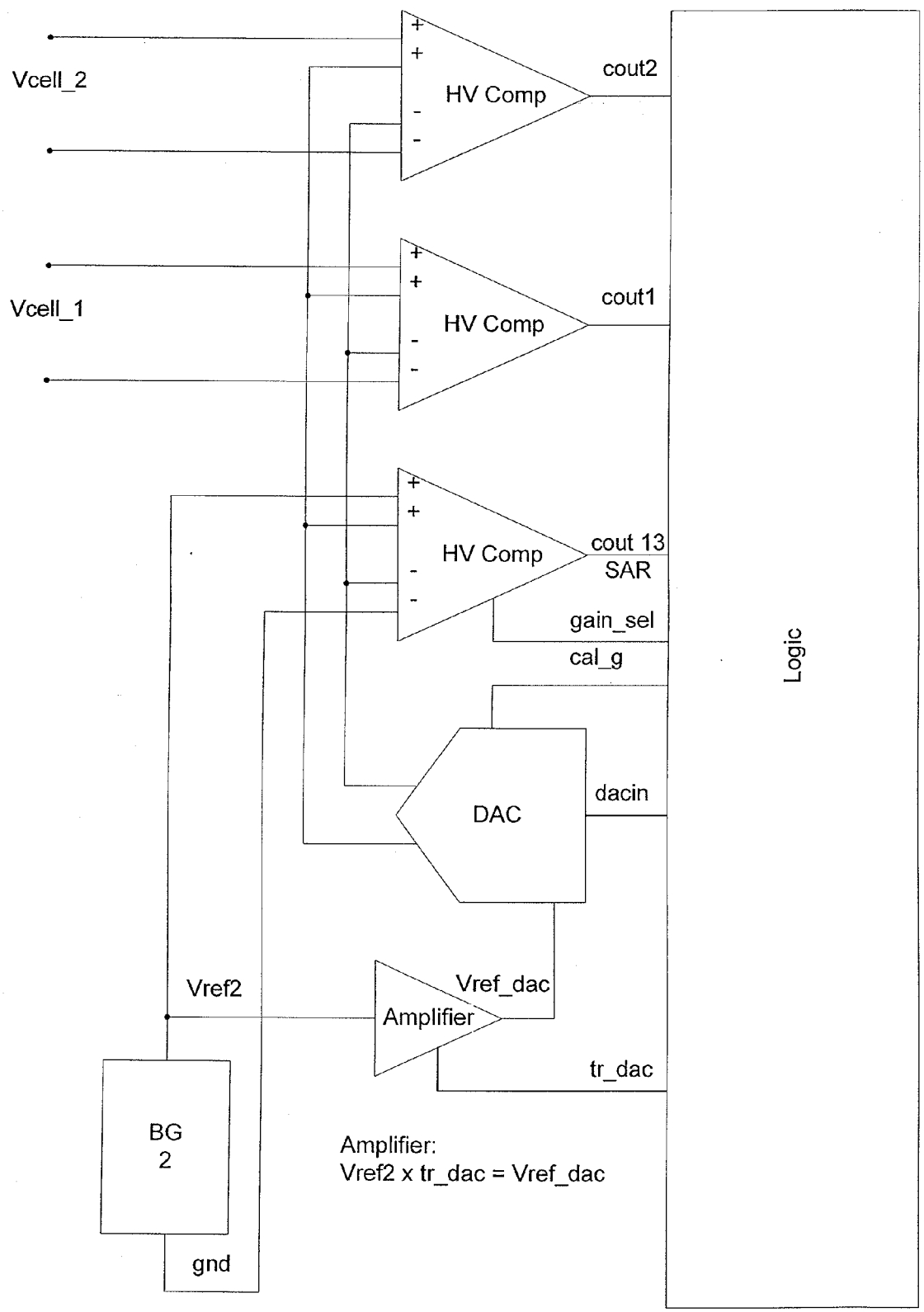
FIG. 1 illustrates a schematic block diagram of a system for measuring electric voltages in accordance with an embodiment of the present invention.

FIG. 1 illustrates a schematic block diagram of a system for measuring electric voltages of battery cells in a battery stack in a further embodiment of the present invention. By means of the measuring system illustrated in FIG. 1, an analog digital converter for batteries with 12 battery cells is implemented by the use of, for instance, 12 high volt comparators HV Comp along with one digital analog converter DAC. This way, the function of an analog digital converter may be replaced for every measuring channel by a digital analog converter (DAC) and a comparator for every measuring channel.

It is consequently the matter of a quasi-parallel measuring method in which the input voltages Vcell_1 and Vcell_2 are measured in every measuring channel in short time intervals, optionally also in a plurality of measurement loops in series. The HV comparators are therefore clocked by the control logic, so that the input voltages Vcell_1, Vcell_2 of the comparators are not evaluated continuously, but for every measuring channel successively.

For this purpose, a digital analog converter DAC generates a reference value that is compared with the input voltages Vcell_1, Vcell_2 in the individual comparators. A current steering DAC in which an analog voltage is generated with currents at a resistor may, for instance, be used as a DAC. It is also possible to use an external reference voltage as a band gap voltage.

A band gap voltage generator BG2 generates a reference voltage Vref2 that is supplied to an additional high volt comparator illustrated in FIG. 1 as the lowermost high volt comparator HV Comp. The additional comparator does not have the function of comparing measured cell voltages with reference voltages, but this additional comparator compares the reference voltage Vref2 from the band gap voltage generator BG2 with the reference voltage generated by the DAC, which enables automatic gain error correction.

The measuring system illustrated in FIG. 1 further comprises an amplifier used for gain trimming of the DAC. For this purpose, the reference voltage Vref2 generated by the band gap voltage generator BG2 is multiplied in the amplifier with a trimming value tr_dac supplied by the control logic, which is illustrated in FIG. 1 by the equation Vref2× tr_dac=Vref_dac. This trimming value tr_dac supplied by the control logic may be different for every measuring channel, so that an individual trimming value tr_dac may be used for every comparator HV Comp. The trimming value tr_dac applied to the amplifier results from the sum of the channel-specific trimming value and of the trimming value deposited by means of automatic gain correction.

The DAC comprises two outputs to generate a differential output signal. The differential high volt comparators are capable of comparing differential signals with one another. Thus, a respective differential cell voltage may be applied to every comparator and be compared there with a reference voltage supplied by the DAC. As is shown in FIG. 1, the cell voltages Vcell_1 and Vcell_2 are each supplied as differential signals to the high volt comparators via two lines and are compared there with the differential signals supplied by the DAC. The results of the comparisons are transmitted by the comparators via their output signals cout1, cout2 to the control logic.

As already mentioned above, the lowermost additional comparator does not have the function of comparing cell voltages, but has to deal with other different measuring problems. Since in addition to the cell voltages numerous other voltages may be measured and compared within the measuring system, the additional comparator is as a differential high volt comparator also adapted to deal with such measuring problems. The additional comparator is, for instance, capable of comparing the reference voltage Vref2 with the reference voltage supplied by the DAC. As a result, the additional comparator generates an output signal cout13_SAR which is in turn transmitted to the control logic.

The DAC may generate a gain error, so that the DAC does not always supply the same maximum output voltage of, for instance, 2.5V, even if the control logic outputs the maximum input value (dacin value full scale) to the DAC. A gain error may also be generated by miscellaneous irregularities in the structure of the DAC. By means of the present invention it is possible to correct such a gain error automatically in that the reference voltage Vref2 is compared and the voltage Vref_dac is modified with the tr_dac value by means of a tracking method until the full scale voltage with the maximum dacin value actually corresponds to the reference voltage Vref2.

The control logic (Logic) then provides for the serial function of the comparators in that it supplies the trimmed reference voltage to the individual comparators via the SAR-DAC and then requests the individual results cout1, cout2, cout13 with the comparators.

In operation, the measuring system according to the invention is adapted to detect all measuring channels in a plurality of measurement loops and to subsequently perform an averaging of the measured cell voltages. In doing so, the control logic first of all starts running through the SAR algorithm for the first channel, wherein the output signal of the first comparator is referred to for setting the subsequent DAC value. The measuring process is repeated for the first measuring channel with increasing reference values until the first comparator toggles, i.e., until the reference value exceeds the cell voltage. After this first conversion has been performed, the control logic changes to the second comparator and thus performs the measurement for the second measuring channel.

Figure 2:
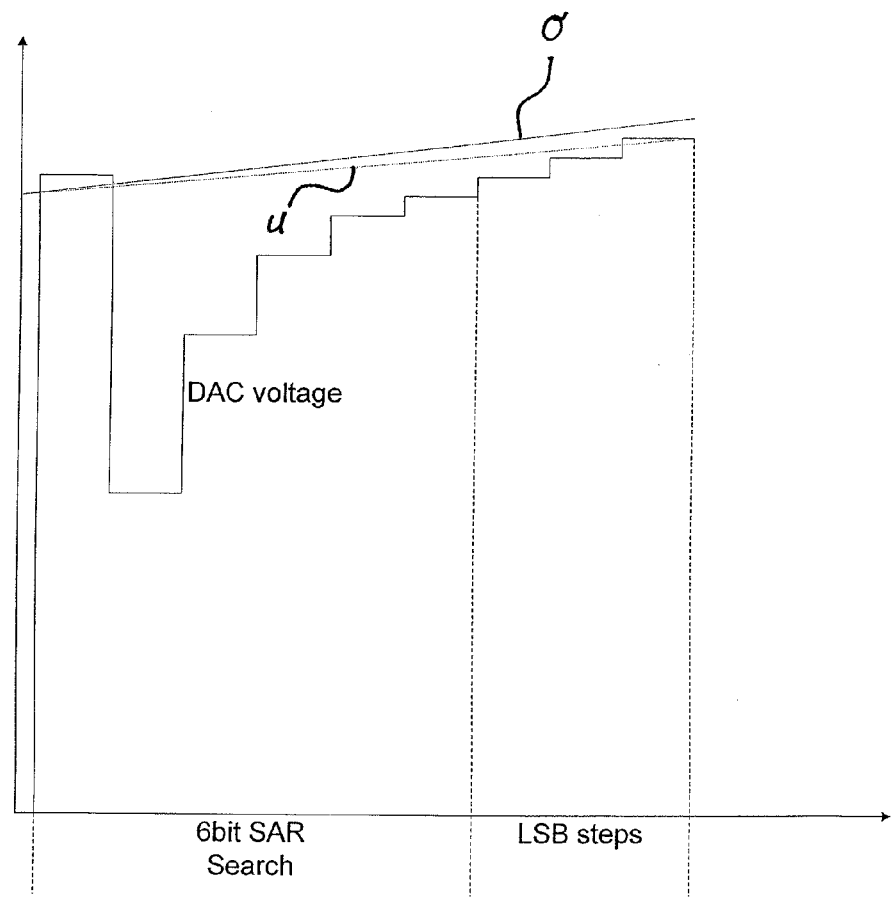
FIG. 2 illustrates diagrams in which electric voltages as well as signal curves are illustrated schematically which may occur in the method and the voltage measuring system in accordance with an embodiment of the invention.
Figure 2:
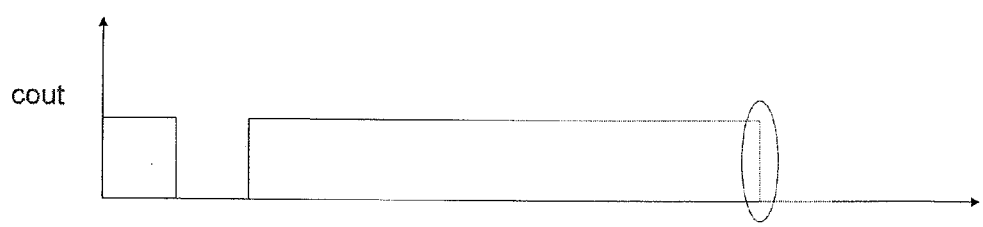
Figure 2:
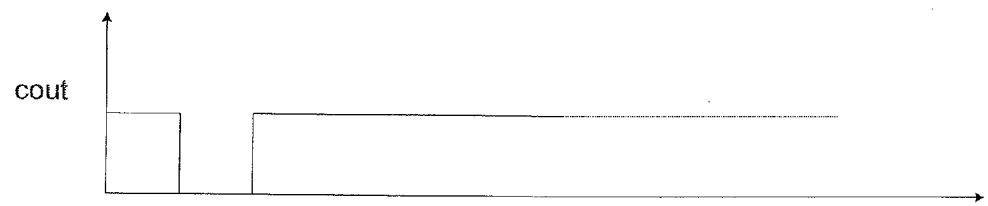
Figure 2:
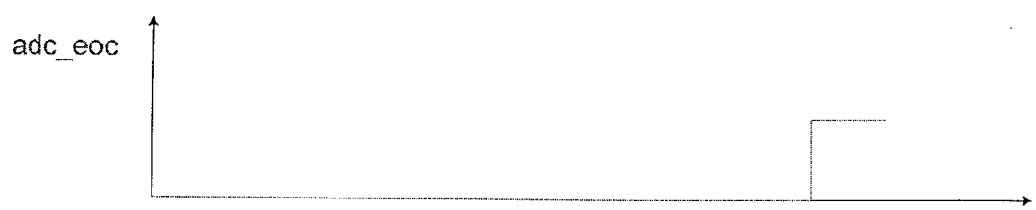

FIG. 2 illustrates a plurality of diagrams in which electric voltages as well as signal curves are illustrated schematically which may occur in the method and the voltage measuring system according to an embodiment of the present invention. The diagrams each illustrate signal and/or voltage curves over the same time axis. Since the cell voltages are not determined simultaneously, but in a quasi-parallel manner one after the other, the situation that the measured cell voltage may change during the measuring time must also be taken into account. In the uppermost diagram two cell voltage curves O and U are therefore illustrated which each increase in the course of measurement. The upper cell voltage curve O has a steeper rise than the lower cell voltage curve U. Such a voltage curve may result from a failure.

The stepped signal curve in the uppermost diagram corresponds to the reference voltage generated by the DAC which is compared with the measured cell voltage in the comparators. The steps of the DAC voltage thus also illustrate the measuring phases performed one after the other. In the first step of the first section (binary search phase) the reference voltage is, for instance, halved. Subsequently the above-described tracking phase is performed to determine the cell voltage.

In the case of the lower cell voltage curve U the reference voltage exceeds the measured cell voltage in the last tracking cycle while the upper cell voltage curve O is not even exceeded by the reference voltage in the last tracking cycle.

In the two middle diagrams of FIG. 2 signal curves of the output signal cout of the comparator are illustrated, wherein the upper signal curve illustrates a valid conversion of the comparator and the lower signal curve illustrates an invalid conversion of the comparator. In the upper signal curve the valid conversion of the comparator is marked by a dashed oval, which corresponds to the time at which the reference voltage of the DAC intersects the input voltage or the measured cell voltage U, respectively, in the last LSB step. This edge in the output signal of the comparator is recognized as a valid conversion by the control logic. In the lower signal curve no valid conversion of the comparator exists, which is revealed by the steady signal curve in the output signal of the comparator.

In the lowermost diagram of FIG. 2 the signal curve of the ADC adc_eoc (End of Conversion) is illustrated, which generates an edge with the occurrence of a valid conversion and hence indicates the end of the tracking cycle. Once a valid conversion has been generated, the ADC may be further used for the next measurement at the next measuring channel.

Figure 3:
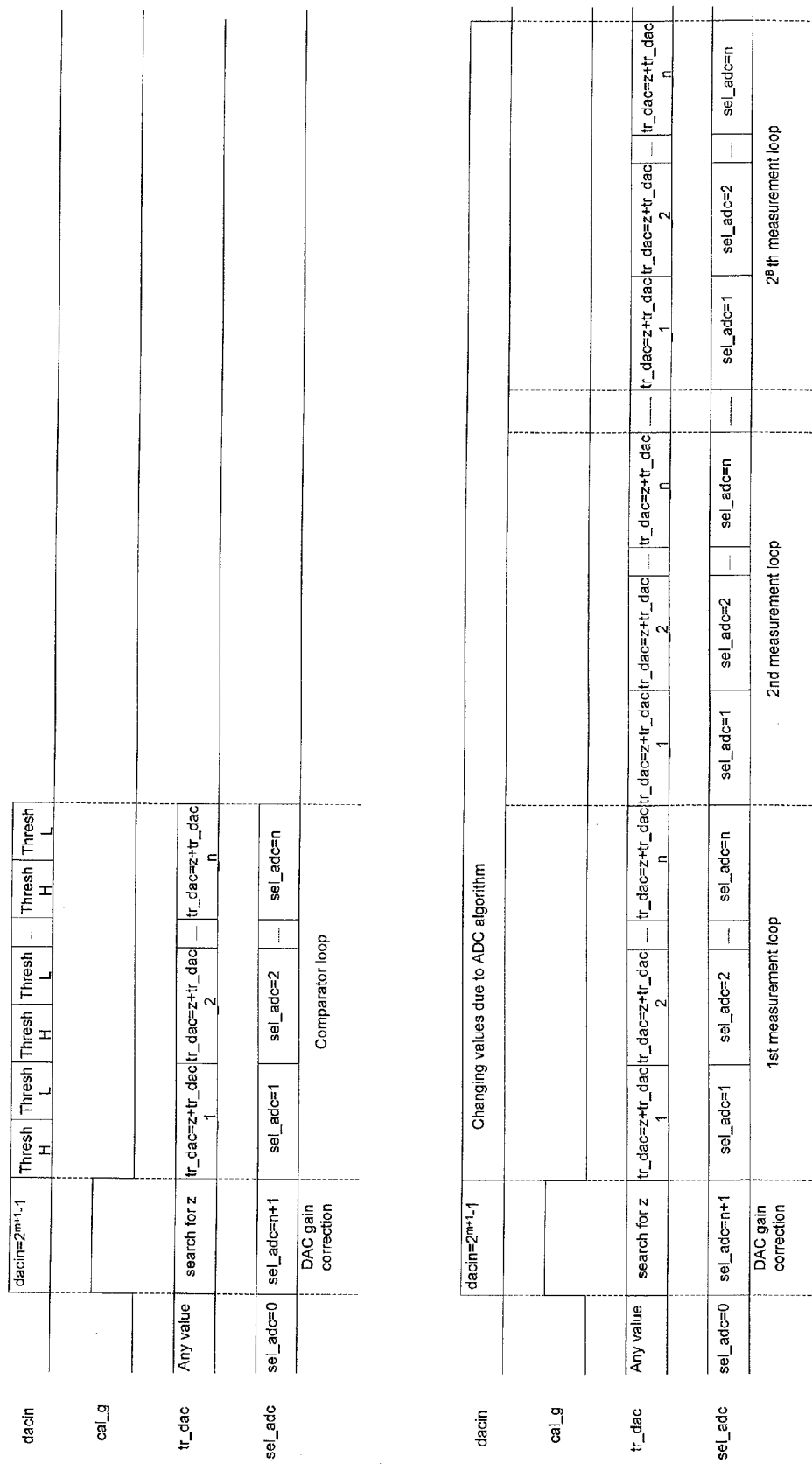
FIGS. 3 to 5 each illustrate a plurality of schematic signal curves as they may occur in the voltage measuring system in accordance with an embodiment of the present invention.
Figure 4:
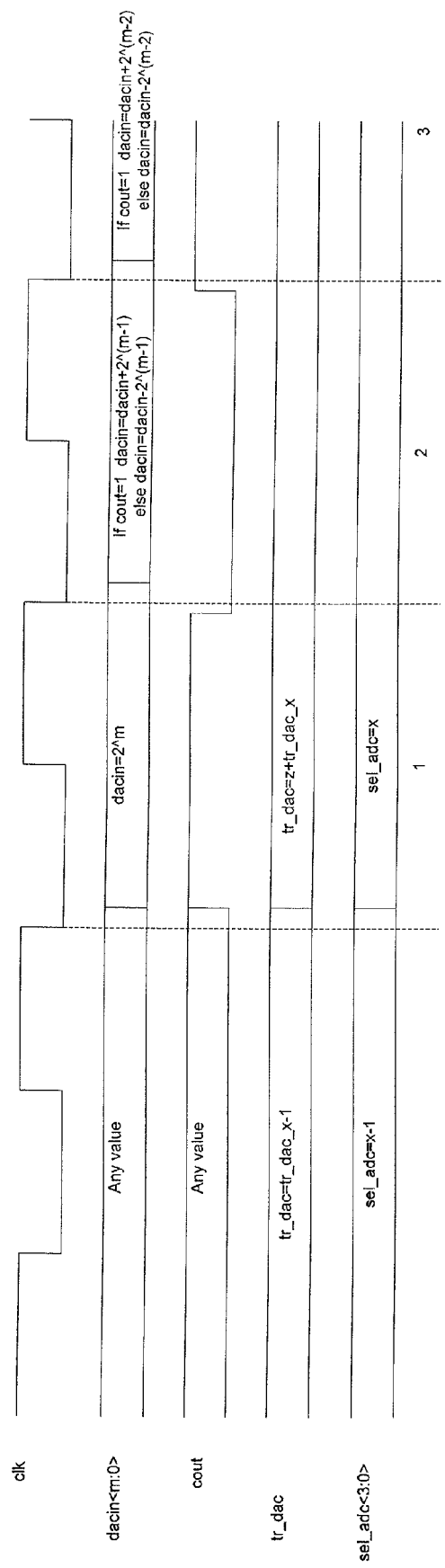
Figure 5:
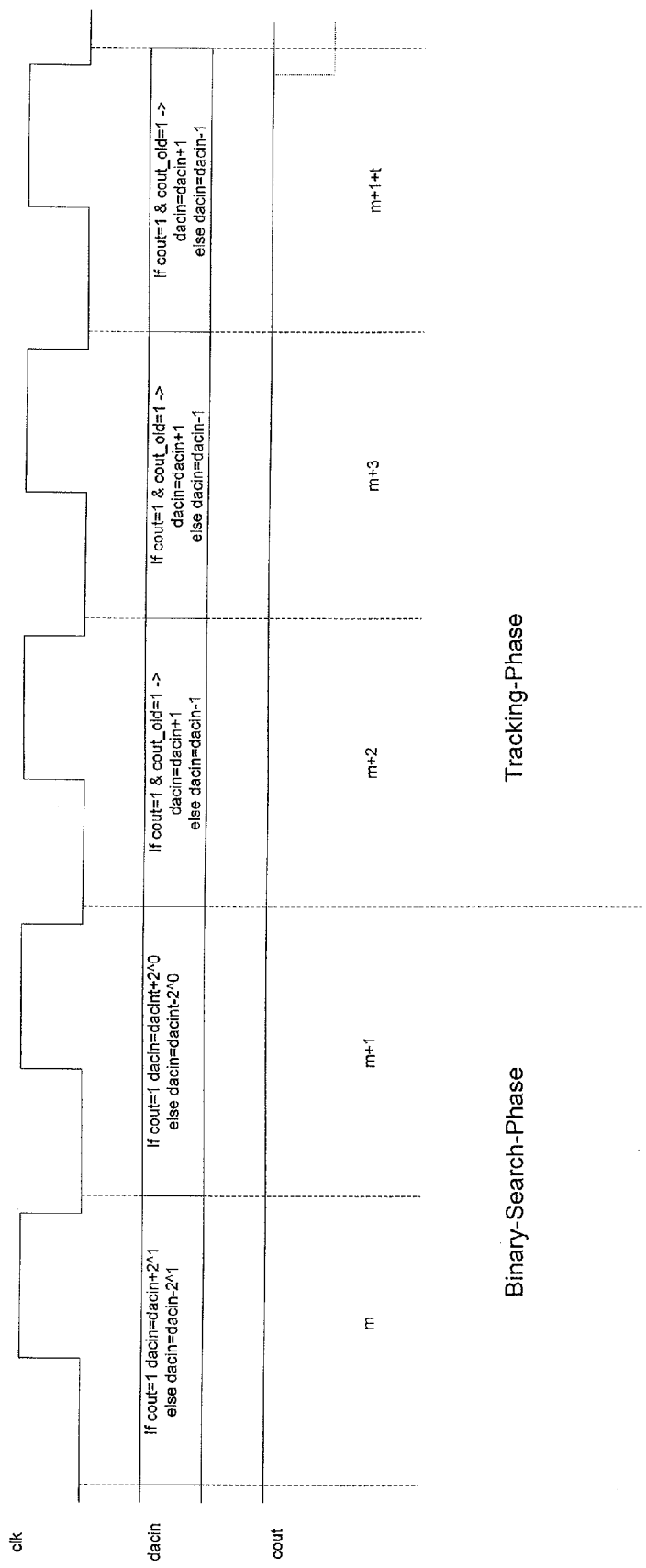

FIGS. 3 to 5 each illustrate a plurality of schematic signal curves as they may occur in the voltage measuring system in accordance with an embodiment of the present invention. The illustrated signal curves occur typically during the performing of a measuring cycle in which the individual cell voltages are limited by means of the window comparator function or measured with the above-described combined SAR-tracking algorithm, respectively.

In a first step "DAC gain correction" gain correction is performed, and then all cell voltages are measured in a number of $2^B$ successive measurement loops. Subsequently, the results of these $2^B$ measurement loops are averaged. The signal curves illustrated in FIGS. 3 to 5 each correspond to the designations of the signal lines illustrated in FIG. 1.

Thus, the signal curve dacin characterizes the progress of the above-described binary search algorithm and the modification thereof as a function of the output signal cout of the comparator. Furthermore, the trimming signal tr_dac for the DAC is illustrated, which is of particular importance if the method according to the invention is applied to a plurality of measuring channels. The time signal clk serves to clock the comparators. The dashed lines serve to illustrate take-over times and simultaneous signal modifications, which is important for a digital implementation.

The upper diagram of FIG. 3 constitutes a measurement cycle in which every channel is checked as to whether its voltage lies in a predetermined range, while the lower diagram describes the second phase in which an averaging of the measuring results of a plurality of measurement loops is performed, wherein n is the number of measuring channels. On principle, the measuring system according to the invention may be used with just one single measurement loop without a statistical averaging of the measuring results, but the measuring result will usually become more reliable by a plurality of measuring processes and a subsequent averaging.

In the upper portion of FIG. 3, the phase of the window comparator function (comparator loop) is illustrated after the automatic gain trimming. The uppermost signal curve dacin in FIG. 3 corresponds to the input value of the DAC. The signal cal_g is high during the automatic gain trimming and therefore indicates when the automatic gain trimming takes place.

During the automatic gain trimming the full scale value is applied to the input of the DAC. The value sel_adc indicates that the additional comparator n+1 that compares the DAC output voltage with the reference voltage is active. Now, as a function of the comparator output, the value tr_dac can be incremented or decremented until the additional comparator n+1 has detected an intersection between the DAC output voltage and the reference voltage. The value tr_dac determined during this intersection is referred to as z.

With the signal change of cal_g from high to low the automatic gain correction is terminated, and by means of the signal sel_adc the first channel is selected. At the signal input dacin the desired higher threshold value Thresh H is applied, while the sum of the previously determined value z and the channel-specific trimming value tr_dac_1 is applied to tr_dac. After an evaluation has taken place by the comparator at the channel 1, the lower threshold value Thresh L is applied to the input of the DAC. After the evaluation by the comparator at the first channel, the second channel is selected by applying of the value 2 to sel_adc. Simultaneously, the trimming value tr_dac changes for the trimming amplifier to the sum of z and the channel-specific trimming value tr_dac_2. This process is repeated in a number of n loops which is dependent on the number of the channels n.

Alternatively, the channel-precise trimming may be renounced. In doing so, the upper threshold value is applied as a reference value to all comparators, and the results of all comparators (cout 1-12) are measured simultaneously. Subsequently, the lower threshold value is applied as a reference value to all comparators and the results of all comparators (cout 1-12) are measured simultaneously. Thus, the comparator function for all channels can be implemented more quickly. With this alternative proceeding it is, however, not possible to trim the DAC for every channel.

The lower part of FIG. 3 describes the phase of the cell voltage measurement which takes place after the automatic gain trimming, wherein it is possible to sequentially measure all channels in a measurement loop. After the automatic gain trimming, the trimming values tr_dac result for every selected channel from the value z and the channel-specific trimming value. The DAC input value, however, results as a function of the voltage applied to the respective channel according to the ADC algorithm with the above-described binary search phase and tracking phase and will be described in conjunction with FIGS. 4 and 5 for a conversion.

FIG. 3 illustrates how the channel number is incremented by means of the signal sel_adc after every conversion and/or how the trimming values tr_dac at the trimming amplifier change in a channel-specific manner. After every channel has been measured once (after termination of the 1$^{st}$ measurement loop and hence after n conversions), the measurement is started beginning with channel 1 and is again performed for every channel. This measuring procedure may be repeated $2^B$ times, whereupon a corresponding averaging of the channel-specific conversions is performed.

In FIGS. 4 and 5 the phase of a cell voltage measurement of one measuring channel is described in detail. In FIG. 4 the first part of the binary search phase is illustrated, and in FIG. 5 the end of the binary search phase and the subsequent tracking phase of a measurement are shown. The transition between the two phases is marked by the dashed lines between steps m+1 and m+2, wherein the conversion is terminated after t tracking steps. In addition to the already described signals dacin, tr_dac, and sel_adc, FIGS. 4 and 5 also illustrate the signal curve from the comparator output of the corresponding channel cout and the time curve of the clock signal clk.

After a channel has been selected by means of sel_adc and hence the appropriate trimming value tr_dac has been applied to the trimming amplifier, the binary search phase starts with the applying of half the full scale value ($2^m$). After the applying of a new input value dacin, the comparator output is referred to for decision with the next falling edge of the clock signal clk for the next dacin value. This is the reason for the case distinction in the following dacin values: In FIG. 4 there would therefore apply in step 2 dacin=$2^m-2^{(m-1)}$, wherein the binary search phase lasts m+1 steps.

In FIG. 5, the end of the binary search phase and the subsequent tracking phase of a measurement are illustrated. As mentioned above, the dashed line in FIG. 5 between the steps m+1 and m+2 designates the changing from the binary search phase to the tracking phase. The tracking phase thus lasts at most until the output signal cout of the comparator toggles and hence indicates a valid conversion, or the maximum number of steps of the tracking phase has been reached.

In the tracking phase the input value of the DAC dacin is incremented or decremented as a function of the comparator signal at the time of the falling clk edge until an edge is detected at the comparator output, i.e., if cout_old does not correspond to cout. After a number of t tracking steps, the conversion of the current channel is terminated and the conversion of the next channel is started. In FIG. 5, m designates the bit number of the DAC and t designates the number of tracking steps in a tracking phase. If the DAC comprises, for instance, 10 bits, then m=9, and the binary search phase is terminated after the tenth step. This means that the binary search phase comprises as many steps as the DAC comprises bits.

If, for instance, an input value of the DAC dacin of a length of 10 bits were set to its highest value (full scale), the 10 bits thereof would all be One and a full scale voltage would be available at the output of the DAC which is dependent on the voltage value Vref_dac since a corresponding transmission ratio was determined by the input value of the DAC dacin.

What is claimed is:

1. A system for measuring electric voltages in batteries with a plurality of individual battery cells, the system comprising:
   a digital analog converter (DAC);
   a plurality of comparators;
   wherein the DAC and the comparators are coupled together to form a measuring circuit with an analog digital converter (ADC);
   wherein the measuring circuit is configured to determine the electric voltages of the individual battery cells; and
   wherein the comparators compare a reference voltage generated by the DAC with the electric voltage of the battery cells over a number of separate measuring channels to the individual battery cells.

2. The system according to claim 1, further comprising digital trigger logic coupled with the ADC to provide a number of measuring channels for the individual battery cells.

3. The system according to claim 1, wherein the ADC is designed to serially measure the electric voltages of the individual battery cells for one or more independent measuring cells.

4. The system according to claim 1, wherein the measuring circuit is configured to measure the electric voltages of the individual battery cells sequentially in a quasi-parallel measuring window by performing a plurality of measurement loops within a time period.

5. The system according to claim 1, wherein the measuring circuit is configured to perform a window comparator function at the battery cells, wherein in a number of comparator loops for all measuring channels both an excess voltage and an undervoltage are checked sequentially to determine whether the measured voltages of the individual battery cells lie within a particular voltage window.

6. The system according to claim 1, wherein the measuring circuit is configured to perform a window comparator function for all measuring channels in parallel, wherein in a first measurement an upper threshold value is applied as a reference value to all comparators and results of all comparators are measured simultaneously, and in a second measurement a lower threshold value is applied as a reference value to all comparators and the results of all comparators are measured simultaneously.

7. A method for measuring electric voltages in batteries with a number of individual battery cells using a measuring circuit comprising at least one digital analog converter (DAC) that constitutes, in combination with a plurality of comparators, an analog digital converter (ADC), the measuring circuit configured to determine the electric voltages of the individual battery cells, the method comprising:
    comparing, by the comparators over separate measuring channels to the battery cells, a reference voltage generated by the DAC with the electric voltages of the individual battery cells, wherein the reference voltage from the DAC is successively increased in a tracking phase that includes a number of tracking steps until the reference voltage exceeds the voltage measured at the battery cell; and
    generating an indication of measured voltage based upon the comparing.

8. The method according to claim 7, wherein in a binary search phase the range of a voltage measured at a battery cell is first of all limited by a binary search method, and in a subsequent tracking phase the reference voltage of the DAC is increased or decreased, respectively, depending on a comparator decision until the comparator generates a corresponding indication that the reference voltage exceeds the voltage measured at the battery cell.

9. The method according to claim 7, wherein during the tracking phase the reference voltage is, by an algorithm executed in the DAC, adapted step by step to a step width predetermined by binary resolution of the DAC and is hence approximated to the voltage measured at the battery cell.

10. The method according to claim 7, wherein the reference voltage generated by the DAC is set to half of a maximum output voltage of the DAC within a binary search phase and is increased or decreased step by step until the voltage measured at the battery cell is defined by a function of the comparator.

11. The method according to claim 7, wherein the tracking phase includes a number of tracking steps and the reference voltage generated by the DAC is compared with the voltage measured at the battery cell in a comparator in every tracking step until the reference voltage exceeds the voltage measured at the battery cell.

12. The method according to claim 11, wherein the battery cells are serially connected to a number of battery blocks or a battery stack.

13. The method according to claim 12, wherein common mode voltages of the battery blocks or battery stacks are suppressed by selected ones of the comparators with respect to the battery cell voltages so as to determine a differential voltage between terminals of the respective battery cell.

14. The method according to claim 7, wherein the measuring circuit is configured to perform excess voltage detection or undervoltage detection for the number of battery cells.

15. A system for measuring electric voltages in batteries with a plurality of battery cells, the system comprising:
    a measuring circuit comprising at least one digital analog converter (DAC) that constitutes, in combination with a plurality of comparators, an analog digital converter (ADC), the measuring circuit configured to determine the electric voltages of the battery cells over a number of measuring channels separately; and
    a trimming amplifier that is adjustable to a predetermined trimming value for every individual measuring channel, so that a reference value generated by the DAC is multiplied with a corresponding factor, so that a reference voltage for corresponding measuring channel results.

16. The system according to claim 15, further comprising an additional comparator configured to compare the reference voltage of the DAC with a band gap voltage of the measuring circuit and, when the reference voltage is lower than the band gap voltage, the trimming value for the trimming amplifier is increased and, when the reference voltage is higher than the band gap voltage, the trimming value for the trimming amplifier is decreased.

17. The system according to claim 16, wherein the measuring circuit is configured to perform gain balancing using the additional comparator in that first of all a maximum value of the DAC is adapted and subsequently a voltage measurement is performed with a comparator so as to avoid a gain error caused by the DAC during voltage measurement.

18. The system according to claim 15, wherein the measuring circuit is configured to individually compensate gain errors relating to individual measuring channels by use of a one-time trimming of the DAC and/or by use of an automatic gain error correction of the DAC during operation.

19. The system according to claim 15, wherein the battery cells comprise lithium ion (LION) cells and/or the batteries are suited as accumulators for electric vehicles.

20. A method for measuring electric voltages in batteries with a number of battery cells, the method comprising using a measuring circuit comprising at least one digital analog converter (DAC) with a number of comparators which are each connected with a battery cell over a measuring channel, wherein the measuring channels are repetitively measured one after the other and in a number of measurement loops.

21. The method according to claim 20, wherein voltage values of every battery cell are each detected individually one after the other in a number of measurement loops, and wherein subsequently an average value of measured voltage values is generated as a function of the number of measurement loops by temporal or statistical averaging.

22. The method according to claim 20, wherein a binary search method with a subsequent tracking phase is performed for each measurement of a measuring channel for a valid conversion of the corresponding comparator.

23. The method according to claim 22, wherein ADC values are each added based upon a valid conversion of the corresponding comparator for every measuring channel in an adder and are subsequently divided by the number of measurement loops performed so as to obtain a statistical average value for the voltage measured.

24. The method according to claim 20, wherein by correction of a gain error at the beginning of every measurement of a cell voltage both the influence of a gain error of the DAC and the influence of an offset error of a buffer for a DAC reference voltage on the measuring accuracy of the measuring circuit are reduced or eliminated.

25. A method for measuring electric voltages in batteries with a number of battery cells, comprising using a measuring circuit comprising at least one digital analog converter (DAC) with a number of comparators which are each connected with a battery cell over a measuring channel, wherein the voltages of every battery cell are detected individually one after the other in a number of measurement series, and wherein subsequently an average value of measured voltage values is generated by temporal or statistical averaging as a function of the number of measurement series.

26. The method according to claim 25, wherein a number of $2^B$ measurement series are performed for a number of n measuring channels and $2^B$ measured voltage values are added by an adder for the averaging and subsequently the last B digits of the digital sum value are neglected.

27. A system for implementing a comparator function with a programmable threshold, the system comprising:
   a digital analog converter (DAC):
   a plurality of comparators, wherein each comparator is configured to compare a reference voltage generated by the DAC with an electric voltage of an individual battery cell, the comparisons being made over a number of separate measuring channels to the individual battery cells.

28. The system according to claim 27, wherein the comparisons are performed sequentially over the measuring channels.

29. The system according to claim 27, wherein the comparisons are performed in parallel over all measuring channels.

* * * * *